US011143954B2

(12) United States Patent
Hsueh et al.

(10) Patent No.: US 11,143,954 B2
(45) Date of Patent: Oct. 12, 2021

(54) MASK PATTERNS AND METHOD OF MANUFACTURE

(71) Applicant: Taiwan Semiconductor Manufacturing Co., Ltd., Hsinchu (TW)

(72) Inventors: Wen-Chang Hsueh, Taoyuan County (TW); Ta-Cheng Lien, Hsinchu County (TW); Chia-Jen Chen, Hsinchu County (TW); Hsin-Chang Lee, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 301 days.

(21) Appl. No.: 16/018,444

(22) Filed: Jun. 26, 2018

(65) Prior Publication Data
US 2019/0391480 A1    Dec. 26, 2019

(51) Int. Cl.
| | | |
|---|---|---|
| *G03F 1/70* | (2012.01) | |
| *G03F 1/38* | (2012.01) | |
| *G03F 1/54* | (2012.01) | |
| *G03F 1/24* | (2012.01) | |
| *G03F 1/36* | (2012.01) | |

(52) U.S. Cl.
CPC ............. *G03F 1/70* (2013.01); *G03F 1/24* (2013.01); *G03F 1/36* (2013.01); *G03F 1/38* (2013.01); *G03F 1/54* (2013.01)

(58) Field of Classification Search
CPC ............. G03F 1/70; G03F 1/36; G03F 1/38
See application file for complete search history.

(56) References Cited

U.S. PATENT DOCUMENTS

| | | |
|---|---|---|
| 8,796,666 B1 | 8/2014 | Huang et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |
| 9,429,835 B2 | 8/2016 | Hsueh et al. |
| 9,529,268 B2 | 12/2016 | Chang et al. |
| 9,548,303 B2 | 1/2017 | Lee et al. |
| 9,869,934 B2 | 1/2018 | Huang et al. |
| 9,869,939 B2 | 1/2018 | Yu et al. |
| 2016/0062226 A1* | 3/2016 | Lin .......................... G03F 1/42 430/5 |

\* cited by examiner

*Primary Examiner* — Daborah Chacko-Davis
(74) *Attorney, Agent, or Firm* — Haynes and Boone, LLP

(57) ABSTRACT

Photomasks and methods of fabricating the photomasks are provided herein. In some examples, a layout for forming an integrated circuit device is received. The layout includes a set of printing features. A region of the layout is identified. The region is at a distance from the set of printing features such that an exposure region associated with a feature in the region does not affect a set of exposure regions associated with the set of printing features. A plurality of non-printing features is inserted into the region. A photomask is fabricated based on the layout.

20 Claims, 9 Drawing Sheets

MASK PATTERNS AND METHOD OF MANUFACTURE

BACKGROUND

The semiconductor device industry has experienced rapid growth. In the course of device evolution, the functional density has generally increased while feature size has decreased. This scaling down process generally provides benefits by increasing production efficiency and lowering associated costs. Such scaling down has also increased the complexity of design and manufacturing these devices.

Photolithography techniques have been used to pattern material layers formed on a semiconductor substrate. A photomask or mask is one of the aspects of the photolithography techniques. After a design house finishes an integrated circuit (IC) design, the IC design is sent to a mask house to fabricate a photomask. Besides the layers of patterns in the IC design, the mask house also takes into consideration optical proximity correction (OPC) and inserts various OPC patterns to compensate for distortions caused by diffraction of radiation that occurs during the use of a lithography tool. While current photomask designs are generally adequate, they are not satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
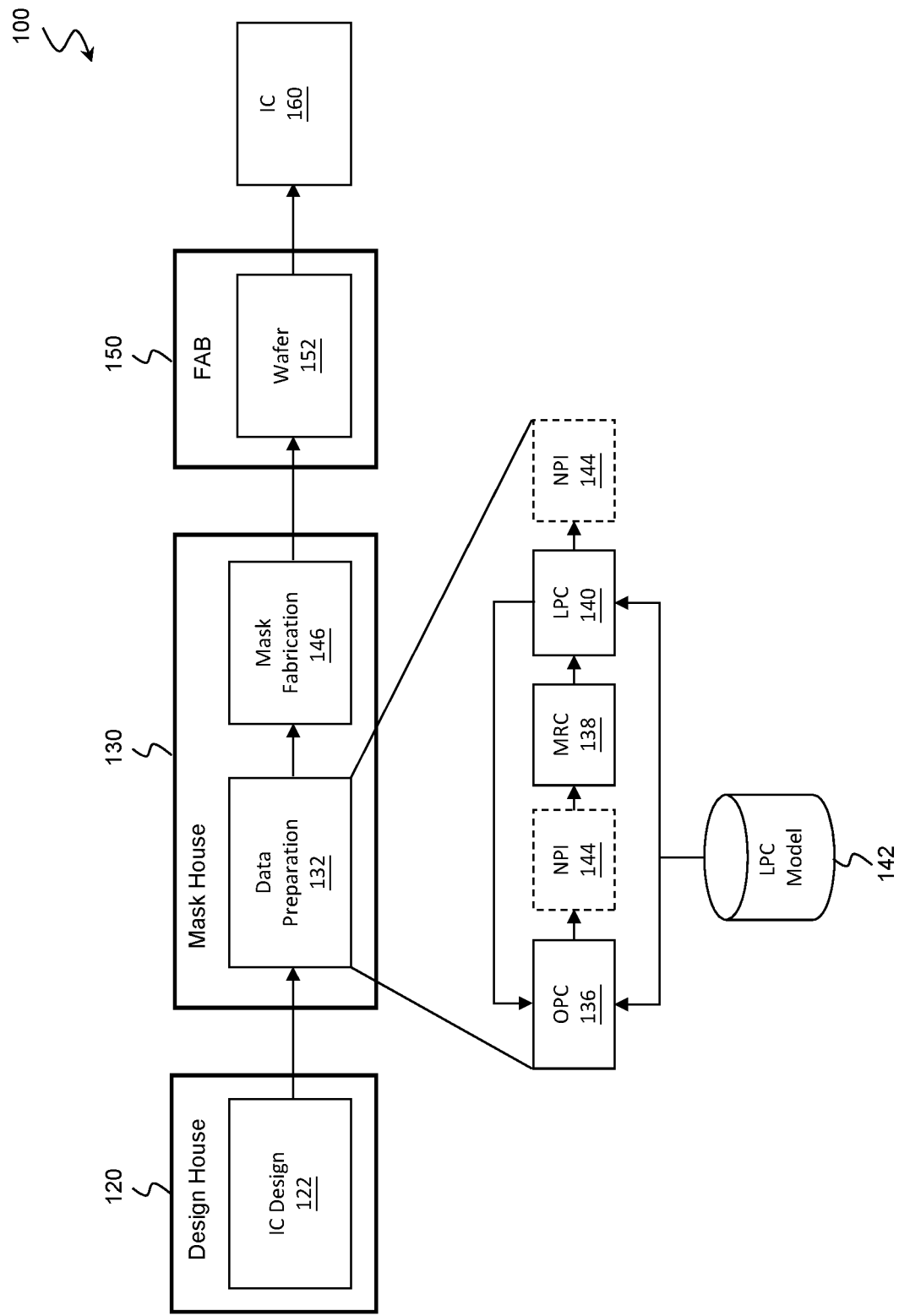
FIG. 1 is a simplified block diagram of an exemplary integrated circuit (IC) manufacturing system and an associated IC manufacturing flow, according to various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

It is noted that provided herein are mask designs as well as mask data preparation and mask fabrication systems for implementing the mask designs. The mask designs may include complex mask patterns for fabricating a semiconductor device, such as an integrated circuit (IC) device, micro-electro-mechanical system (MEMS), light emitting diodes (LED), and/or other semiconductor devices. The patterns discussed and illustrated herein are exemplary only and the mask data is not constrained to any type of feature (e.g., contact, conductive line, diffusion region, etc.) or any type of device. As discussed below, one or more aspects of the data preparation may not even be used in mask formation, but applied to other lithography methods used to define and fabricate a semiconductor device (e.g., maskless lithography).

FIG. 1 is a simplified block diagram of an embodiment of an integrated circuit (IC) manufacturing system 100 and an IC manufacturing flow associated with the IC manufacturing system. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an IC device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may be owned by a single larger company, and may even coexist in a common facility and use common resources.

The design house (or design team) 120 generates an IC design layout 122 (or layout 122). The IC design layout 122 includes various geometrical patterns designed for an IC device 160, based on a specification of the IC device 160 to be manufactured. The geometrical patterns correspond to patterns of metal, oxide, dielectric, or semiconductor layers that make up the various components of the IC device 160 to be fabricated. The various layers combine to form various IC features. For example, a portion of the IC design layout 122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The design house 120 implements a proper design procedure to form the IC design layout 122. The design procedure may include logic design, physical design, and/or placement and routing. The IC design layout 122 is presented in one or more data files having information of the geometrical patterns. For example, the IC design layout 122 can be expressed in a GDSII file format or DFII file format. It is noted that the IC design layout 122 include features that are to be transferred to the wafer 152. These features of the IC design layout 122 can be referred to as printing features or main pattern because they are the main features and patterns to be "printed" by photolithography onto the wafer 152.

The mask house 130 uses the IC design layout 122 to manufacture one or more masks to be used for fabricating the various layers of the IC device 160 according to the IC design layout 122. The mask house 130 performs mask data preparation 132, where the IC design layout 122 is translated into a form that can be physically written by a mask writer, and mask fabrication 146, where the design layout prepared by the mask data preparation 132 is modified to comply with a particular mask writer and/or mask manufacturer and is then fabricated. In the present embodiment, the mask data preparation 132 and mask fabrication 146 are illustrated as separate elements, however, the mask data preparation 132 and mask fabrication 146 can be collectively referred to as mask data preparation.

The mask data preparation 132 may include an optical proximity correction (OPC) operation 136, a mask rule checker (MRC) 138 and a lithography process checker (LPC) 140, an LPC model 142, and a non-printing feature inserter (NPI) 144. OPC 136 uses lithography enhancement techniques to compensate for image errors, such as those that can arise from diffraction, interference, or other process effects. OPC 136 may add assist features, such as scattering bars, serifs, and/or hammerheads to the IC design layout 122 according to optical models or rules such that, after a lithography process, a final pattern on a wafer is improved with enhanced resolution and precision. The assist features can also be referred to as the OPC patterns. In some implementations, the OPC patterns may include patterns that correspond to the first-order diffraction, the second-order diffraction and the third-order diffraction. The OPC patterns that correspond to the first-order diffraction can be referred to as the first-order OPC patterns. The OPC patterns that correspond to the second-order diffraction can be referred to as the second-order OPC patterns. Similarly, the OPC patterns that correspond to the third-order diffraction can be referred to as the third-order OPC patterns. In terms of distance from the printing features or main patterns, the first-order OPC patterns are closest to the main patterns and the third-order OPC patterns are farthest from the main printing feature. The second-order OPC patterns fall midpack in terms of their distance to the main patterns. The mask data preparation 132 can include further resolution enhancement techniques, such as off-axis illumination, sub-resolution assist features, phase-shifting masks, other suitable techniques, or combinations thereof.

MRC 138 checks the IC design layout that has undergone processes in OPC 136 with a set of mask creation rules which may contain certain geometric and connectivity restrictions to ensure sufficient margins, to account for variability in semiconductor manufacturing processes. MRC 138 modifies the IC design layout to compensate for limitations during mask fabrication 146. In some scenarios, MRC 138 may undo part of the modifications performed by OPC 136 in order to meet mask creation rules. Consequently, resultant IC masks may not produce desirable IC features on a wafer. Enhancements in OPC 136 and MRC 138 processes according to various aspects of the present disclosure will be described in greater details below.

LPC 140 simulates processing that will be implemented by the IC manufacturer 150 to fabricate the IC device 160. LPC 140 simulates this processing based on the IC design layout 122 to create a simulated manufactured device, such as the IC device 160. In one embodiment, LPC 140 determines what shape a hypothetical photomask having a feature thus modified by OPC 136 and MRC 138 would produce on a wafer if the photomask was exposed by a photolithography tool described by the LPC models (or rules) 142. A simulated shape is called a contour. The simulated manufactured device includes simulated contours of all or a portion of the IC design layout 122. The LPC models (or rules) 142 may be based on actual processing parameters of the IC manufacturer 150. The processing parameters can include parameters associated with various processes of the IC manufacturing cycle, parameters associated with tools used for manufacturing the IC, and/or other aspects of the manufacturing process. LPC 140 takes into account various factors, such as aerial image contrast, depth of focus ("DOF"), mask error sensitivity ("MEEF"), other suitable factors, or combinations thereof.

After a simulated manufactured device has been created by LPC 140, if the simulated device is not close enough in shape to satisfy design rules, certain steps in the mask data preparation 132, such as OPC 136 and MRC 138, may be repeated to refine the IC design layout 122 further. If the simulated device is close enough in shape to satisfy design rules, the mask data preparation 132 may proceed to NPI 144. NPI 144 identifies a plurality of dense regions and a plurality of isolated regions in the IC design layout 122 checked by the LPC 140. In addition, NPI 144 may identify in the IC design layout 122 a non-printing feature insertion (NPI) region that is at a distance from the printing features such as an exposure region of a feature in the region does not affect the exposure regions associated with the printing features. The NPI region so identified is farther away from the printing features than the OPC patterns, including the first-order, second-order, and third-order OPC patterns. To bridging the patterns density difference between the plurality of dense regions and the plurality of isolated regions, NPI 144 may insert, within the identified NPI regions of the IC design layout 122, a plurality of non-printing features that are closer to the plurality of isolated regions than to the plurality of dense regions. In some instances, NPI 144 may insert a plurality of non-printing features within the NPI regions that are identified within the isolated regions. The non-printing features here will not be transferred onto the wafer 152. The OPC patterns are different from the non-printing feature in that the OPC patterns affect exposure regions corresponding to the printing features but the non-printing features do not affect the exposure regions corresponding to the printing features. In some embodiments, the NPI 144 may identify the region outside an area populated by printing features and OPC patterns as the NPI region. In those embodiments, the NPI region and the isolated region can coincide. In some other embodiments, the NPI 144 can take into consideration whether certain printing features are especially sensitive to debris particles or whether debris particles are coming from a known source and place the NPI region accordingly.

In an alternative embodiment, NPI 144 is performed after OPC 136 but before MRC 138. In this alternative embodiment, the operation of NPI 144 is based on the post-OPC 136 IC design layout 122, rather than the IC design layout after MRC 138 and LPC 140. The alternative embodiment enjoys the benefits of having MRC 138 and LPC 140 to check whether the insertion of the non-printing features in the NPI regions may violate any mask creation rules or may result in a simulated contour that violates the design rule.

It should be understood that the above description of the mask data preparation 132 has been simplified for the purposes of clarity, and data preparation may include additional features such as a logic operation (LOP) to modify the IC design layout according to manufacturing rules, a retarget process (RET) to modify the IC design layout to compensate for limitations in lithographic processes used by IC manufacturer 150. Additionally, the processes applied to the IC design layout 122 during mask data preparation 132 may be executed in a variety of different orders.

After mask data preparation 132 and during mask fabrication 146, a photomask (mask) or a group of photomasks (masks) are fabricated based on the modified IC design layout 122. For example, a radiation beam, such as an electron-beam (e-beam) or a mechanism of multiple e-beams, is used to form a pattern on a mask (photomask or reticle) based on the modified IC design layout 122. The photomask can be formed in various technologies. In one embodiment, the mask is formed using binary technology. A radiation beam, such as an ultraviolet (UV) beam, used to expose the image sensitive material layer (e.g., photoresist) coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the photomask is formed using a phase shift technology and can be referred to as the phase shift mask (PSM). In the phase shift mask, various features in the pattern formed on the mask are configured to have proper phase difference to enhance the resolution and imaging quality. In various examples, the phase shift mask can be attenuated PSM or alternating PSM. In some embodiments, the phase shift mask includes a substrate made of a low thermal expansion material (LTEM) or fused quartz. The LTEM can include $TiO_2$ doped with $SiO_2$. The phase shift mask may include a reflective multilayer (ML) deposited on the LTEM substrate. The ML can include a plurality of film pairs such as molybdenum-silicon (Mo—Si) film pairs (e.g. a layer of Mo above or below a layer of Si in each film pair). Alternatively, the ML may include Mo/beryllium (Mo/Be) film pairs, or other suitable materials that are configurable to be highly reflective of the EUV light. The phase shift mask may include a capping layer, such as a ruthenium (Ru) layer, deposited on the ML. The phase shift mask may further include one or more absorption layers and phase shifting layers, such as a tantalum boron nitride (TaBN) layer, a chromium (Cr) layer, an iron oxide (FeO) layer, a zirconium silicon oxide (ZrSiO) layer, a silicon nitride (SiN) layer, a molybdenum silicon oxynitride ($MoSiON_x$) layer, a titanium nitride (TiN) layer, a tantalum boron oxide (TaBO) layer, a chromium oxynitride ($Cr_xO_yN_z$) layer, an aluminum oxide ($Al_xO_y$) layer, or a combination thereof. The absorption layer is patterned to define a layer of the IC design layout 122.

The IC manufacturer 150, such as a semiconductor foundry, uses the photomask (or photomasks) fabricated by the mask house 130 to fabricate the IC device 160. The IC manufacturer 150 is an IC fabrication business that can include a myriad of manufacturing facilities for the fabrication of a variety of different IC products. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business. In the present embodiment, a wafer or semiconductor wafer 152 is fabricated using the photomask (or photomasks) to form the IC device 160. The semiconductor wafer 152 includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer 152 may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, and/or other suitable processes.

A lithography system 1500 for exposing the semiconductor wafer 152 at the IC manufacturer 150 is described with reference to the block diagram in FIG. 2. The lithography system 1500, which may also be referred to as a scanner, is operable to perform a lithographic exposure process utilizing a characteristic radiation source and exposure mode. In the illustrated embodiments, the lithography system 1500 is an extreme ultraviolet (EUV) lithography system designed to expose the semiconductor wafer 152 using EUV radiation having a wavelength ranging between about 1 nm and about 100 nm. In some exemplary embodiments, the lithography system 1500 includes a radiation source 102 that generates EUV radiation with a wavelength centered at about 13.5 nm. In one such embodiment, an EUV radiation source 102 utilizes laser-produced plasma (LPP) to generate the EUV radiation by heating a medium such as droplets of tin into a high-temperature plasma using a laser.

The lithography system 1500 may also include an illuminator 104 that focuses and shapes the radiation produced by the radiation source 102. The illuminator 104 may include refractive optical components, including monolithic lenses and/or array lenses (e.g., zone plates), and may include reflective optical components, including monolithic mirrors and/or mirror arrays. The number of optical components shown FIG. 2 have been reduced for clarity, and in actual embodiments, the illuminator 104 includes dozens or even hundreds of lenses and/or mirrors. The optical components are arranged and aligned to project radiation emitted by the radiation source 102 onto a mask 106 (or photomask 106) retained in a mask stage 108. The photomask 106 is fabricated by mask fabrication 146 in FIG. 1. The optical components of the illuminator 104 may also shape the radiation along the light path in order to produce a particular illumination pattern upon the mask 106.

After passing through or reflecting off the photomask 106, the radiation is directed through a projection optics module 110, also referred to as a projection optics box (POB). Similar to the illuminator 104, the projection optics module 110 may include refractive optical components, including monolithic lenses and/or array lenses (e.g., zone plates), and may include reflective optical components, including monolithic mirrors and/or mirror arrays. The optical components of the projection optics module 110 are arranged and aligned to direct radiation transmitted through or reflecting off the mask 106 and to project it onto the semiconductor wafer 152, such as the illustrated semiconductor substrate or any other suitable workpiece, retained in a substrate stage 114. In addition to guiding the radiation, the optical components of the projection optics module 110 may also enlarge, narrow, focus, and/or otherwise shape the radiation along the light path.

Radiation projected by the projection optics module 110 on the semiconductor wafer 152 causes changes in a photosensitive component of the target. In an example, the semiconductor wafer 152 includes a semiconductor substrate with a photoresist 116. Portions of the photoresist 116 that are exposed to the radiation undergo a chemical transition making them either more or less sensitive to a developing process. The portions of the photoresist 116 that are exposed can be referred to as an exposure region or exposure regions. In an exemplary embodiment, after the exposure, the photoresist 116 undergoes a post-exposure baking (PEB), developing, rinsing, and drying in order to complete the transition. Subsequent processing steps performed on the semiconductor wafer 152 may use the pattern of the remaining photoresist 116 to selectively process portions of the semiconductor wafer 152.

As noted above, a number of effects may cause the pattern formed in the photoresist 116 to differ from the intended pattern. These may include optical effects such as diffraction, fringing, and interference. Differences in the pattern may also be caused by aspects of the lithography system 1500. For example, the illumination provided by the system 100 may vary across a semiconductor wafer 152 or between semiconductor wafers 152. In other words, even with defect-free optics and masks, the complexities of the beam paths and other optical effects within the lithography system 1500 may cause the dose (i.e., the exposure intensity) to vary across the surface of a given semiconductor wafer 152 and may cause the dose to vary from wafer to wafer. Similarly, the focus of the projected features may vary across a semiconductor wafer 152 and between semiconductor wafers 152 due to the beam path, the quality of the optics, variations in the semiconductor wafer 152, irregularities the photoresist 116 surface, and/or other factors. Accordingly, as described above in conjunction with FIG. 1, OPC patterns can be inserted into the IC design layout 122 on the semiconductor wafer 152 to compensate for various optical effects and process conditions such as dose variations, focus variations, manufacturing imperfections including mask error, and/or other conditions that impact the features formed in the photoresist 116. In addition, MRC 138 and LPC 140 can be used to ensure no mask creation rules and no design rules are violated by the insertion of OPC patterns.

Figure 2:
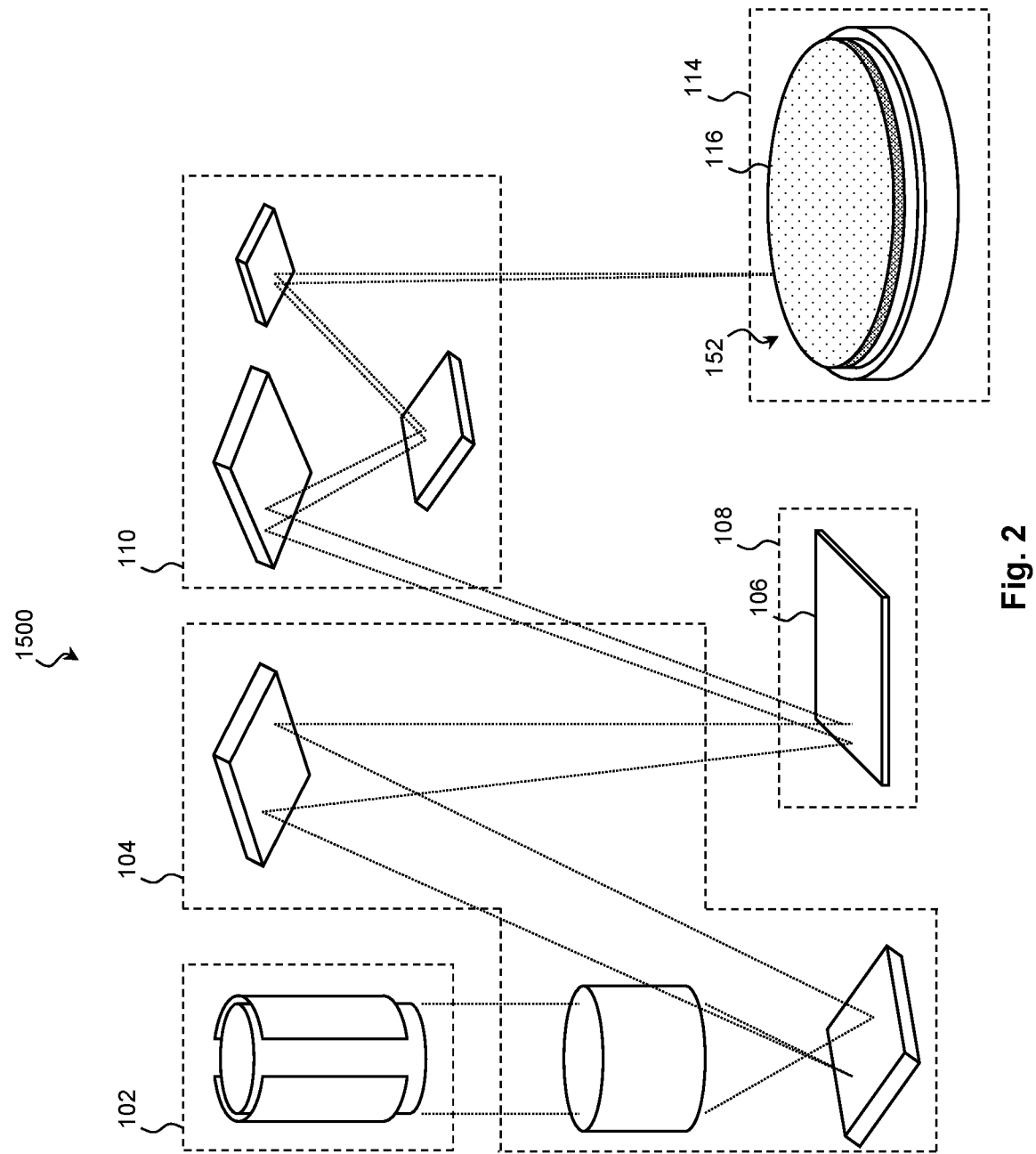
FIG. 2 is a block diagram of a lithography system according to various embodiments of the present disclosure.
Figure 3:
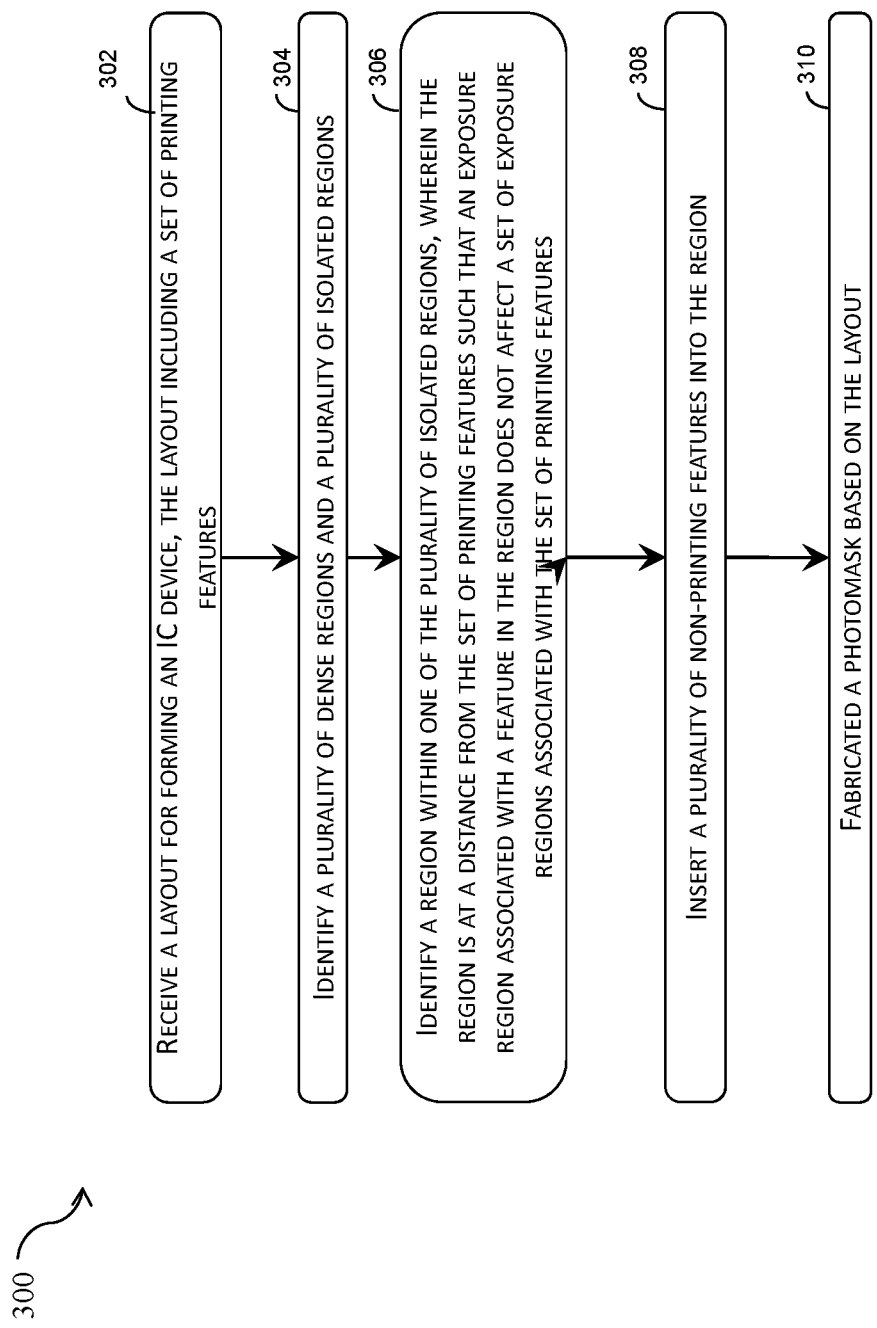
FIG. 3 illustrates a flow chart of an exemplary method of fabricating a photomask according to various embodiments of the present disclosure.

Referring now to FIG. 3, illustrated is a flow chart of an exemplary method 300 of fabricating a photomask, such as the photomask 106 in FIG. 2, according to various embodiments of the present disclosure. The method 300, as discussed below, inserts a plurality of non-printing features into a non-printing feature insertion (NPI) region of the IC design layout. The NPI regions are at a distance from a set of printing features of the IC design layout such that an exposure region associated with a non-printing feature in the region does not affect a set of exposure regions associated with the set of printing features. The method 300 is merely an example, and is not intended to limit the present disclosure beyond what is explicitly recited in the claims. Additional operation can be provided before, during, and after the method 300, and some operations can be replaced, eliminated, or moved around for additional embodiments of the method 300. The method 300 will be described in conjunction with FIGS. 1, 2, 4A, 4B, and 4C.

Figure 4A:
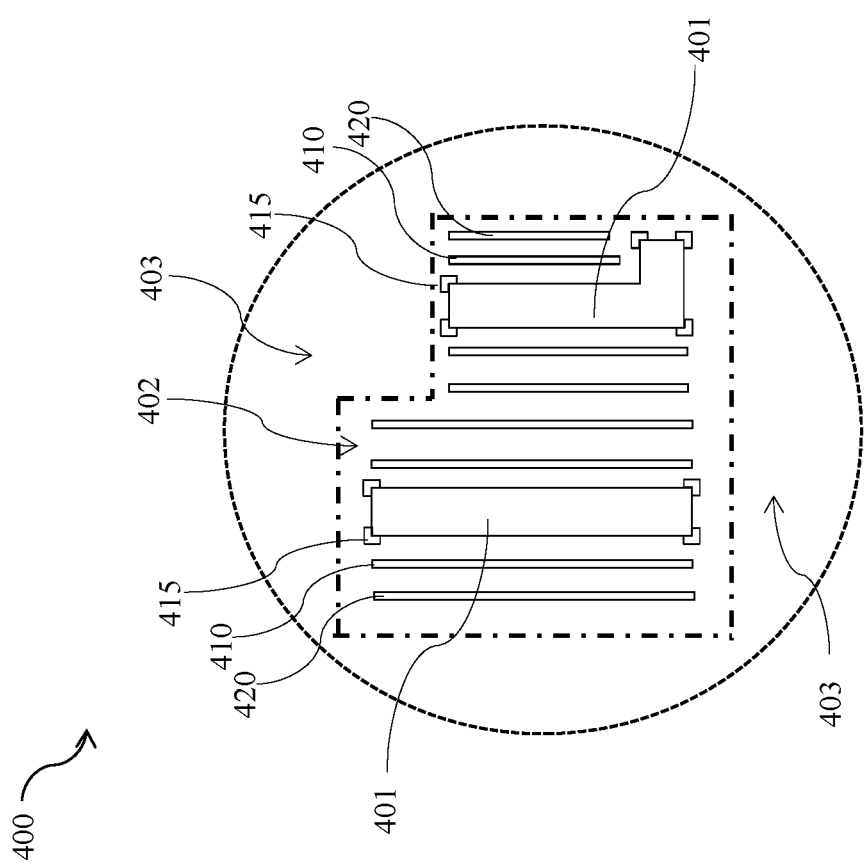
FIG. 4A is a schematic diagrammatic illustration of dense regions and isolated regions relative to OPC patterns on a photomask, according to various embodiments of the present disclosure.

Referring to FIGS. 3 and 4A, the method 300 begins at block 302 where a layout 400 for forming an IC device is received. Similar to the IC design layout 122 in FIG. 1, the layout 400 may be in various file formats and defines the design of, for example, the integrated circuit. In an embodiment, the layout 400 is in a GDS (e.g., GDSII) file format. In another embodiment, the layout 400 is in an OASIS file format. In yet another embodiment, the layout 400 is in a DFII file format. The layout 400 however may be in other formats, now known or later developed. The layout 400 can include a set of printing features 401 that are to be transferred to a mask, such as the mask 106 in FIG. 2, and after being modified by OPC 136 in FIG. 1, to a semiconductor wafer, such as the semiconductor wafer 152 in FIG. 2. The set of printing features 401 may include, for example, gate features, source/drain features, capacitor plates, diffusion regions, conductive lines, vias, contacts, and/or various other semiconductor features including features typical of devices formed using complementary metal oxide semiconductor (CMOS) processes. As noted above, the set of printing features 401 can also be referred to as main patterns 401.

The layout 400 can include multiple OPC features around the set of printing features 401. The OPC features may include a plurality of first-order OPC features, such as scattering bars 410 and hammerheads 415 and a plurality of second-order OPC features, such as scattering bars 420. The first-order OPC features are closer to the printing features 401 than the second-order OPC features. In some embodiments, the layout 400 can include third-order OPC features. The third-order OPC features are farther away from the printing features 401 than the second-order OPC features. As described above, the first-order, second-order, and third-order OPC features act on first-order, second-order, and third-order diffractions and therefore affect the exposure region of the printing features 401. The OPC features are, however, not going to be printed on a semiconductor wafer as they have widths/lengths that are smaller than a critical size such that they do not reflect sufficient radiation to expose photoresists on the semiconductor wafer. The OPC features surround the printing features 401 and increase the feature density in adjacent areas.

Referring to FIG. 3 and referring still to FIG. 4A, the method 300 then proceeds to block 304 where a plurality of dense regions (such as a dense region 402) and a plurality of isolated regions (such as an isolated region 403) are identified. The identification at the block 304 can be carried out by determining a pattern density distribution throughout the layout 400. For example, a unit area can be determined in relation to a critical dimension of the printing features, a standard cell, or a functional block. The pattern density for each unit area is then surveyed across the layout 400. A distribution of pattern density across the layout 400 can then be determined based on the survey. A dense region 402 can be determined if the pattern density within a region exceeds a first threshold and an isolated region 403 can be determined if the pattern density within a region falls below a second threshold. Each of the first and second thresholds can be a statistical characteristic of the distribution of pattern density across the layout 400. For example, the first and second threshold can be a median value or an arithmetic average of the distribution of pattern density across the layout 400. In some embodiments, the first and second thresholds can be identical. In some other embodiments, the first and second thresholds can be different values.

Figure 4B:
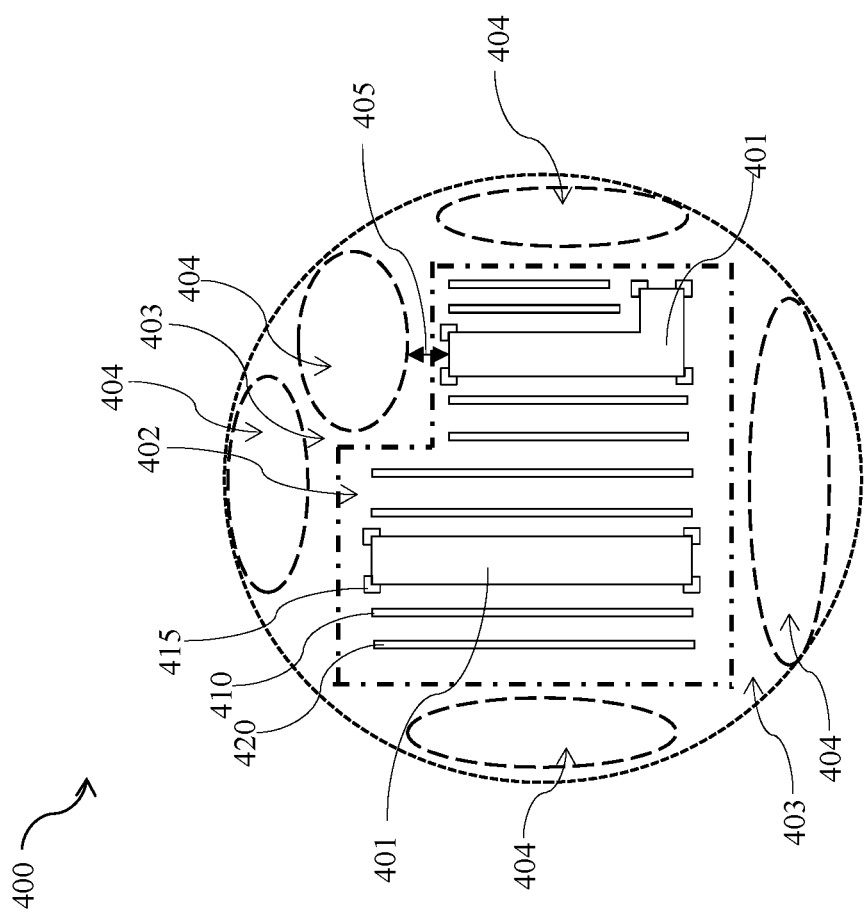
FIG. 4B is a schematic diagrammatic illustration of a plurality of non-printing insertion (NPI) regions relative to printing features on a photomask, according to various embodiments of the present disclosure.

Referring to FIGS. 3 and 4B, the method 300 then proceeds to block 306 where a non-printing feature insertion region 404 (NPI region 404) is identified within one of the plurality of isolated regions 403. The NPI region 404 may be at a distance from the set of printing features 401 such that an exposure region associated with a non-printing feature in the NPI region 404 does not affect a set of exposure regions associated with the set of printing features 401. As illustrated in FIG. 4B, multiple NPI regions 404 are identified in the layout 400. As compared to OPC patterns 410, 420, and 415 that may affect the exposure of the set of printing features 401 by acting on the first-order, second-order and even third-order diffraction, the NPI region 404 is farther away from the set of printing features 401 such that any non-printing feature in the NPI region 404 does not interact with the diffraction of the radiation source and therefore does not affect the image of the printing features 401 on a wafer, such as the semiconductor wafer 152 in FIG. 2. Put differently, the NPI region 404 is farther away from the set of printing features 401 than the first-order, second-order, and third-order OPC patterns. In an alternative embodiment, the NPI region 404 can be regions outside an area populated with the OPC patterns and the printing features 401. In this alternative embodiment, the NPI region 404 is determined after an OPC process, such as the OPC 136 in FIG. 1, is performed to incorporate OPC patterns into an area of the layout 400 around the main patterns or printing features 401. The NPI region 404 is then positioned outside the area where the OPC patterns are inserted. In some embodiments, an NPI region 404 is located a minimum distance 405 away from a main pattern (or printing feature) 401. In some instances, the minimum distance 405 can be between about 200 nm and about 8000 nm. While each of the NPI regions 404 is depicted as an oval in FIG. 4B for simplicity and clarify, it should be understood that the NPI region 404 can be of any shape depending on the distribution of printing features 401 and OPC patterns surrounding the printing features 401. In some instances, depending on the method for determining an isolated region 403, the NPI region 404 and the isolated region 403 can substantially coincide. For example, as the pattern density is mostly contributed by printing features 401 and OPC features, the regions outside of the printing features 401 and OPC features can both be the isolated region 403 and the NPI region 404.

As will be described below in conjunction with FIG. 7, the non-printing features 406 can give rise to an electric field stronger than ones generated at printing features such that debris particles can be attracted to and trapped at the non-printing features 406. In some instances, the layout 400 can include certain areas (hereinafter referred to as a "debris sensitive area") that are especially sensitive to debris particles due to the dimension or shape of the printing features 401 or due to a source of debris particles. To reduce the amount of debris particles from reaching the debris sensitive area, non-printing features 406 can be placed adjacent to or in proximity of the debris sensitive area to attract and trap debris particles before they reach the debris sensitive area. In those instances, the identification of the NPI region 404 can take into consideration the location of the debris sensitive area. For example, the NPI region 404 can be identified within the isolated region 403 and adjacent to or in proximity of the debris sensitive area. In those embodiments, insertion of the non-printing features 406 in the NPI region 404 not only evens out the pattern density distribution during fabrication of a photomask based on the layout 400 but also prolongs the on-time and lifetime of the photomask so fabricated.

Figure 4C:
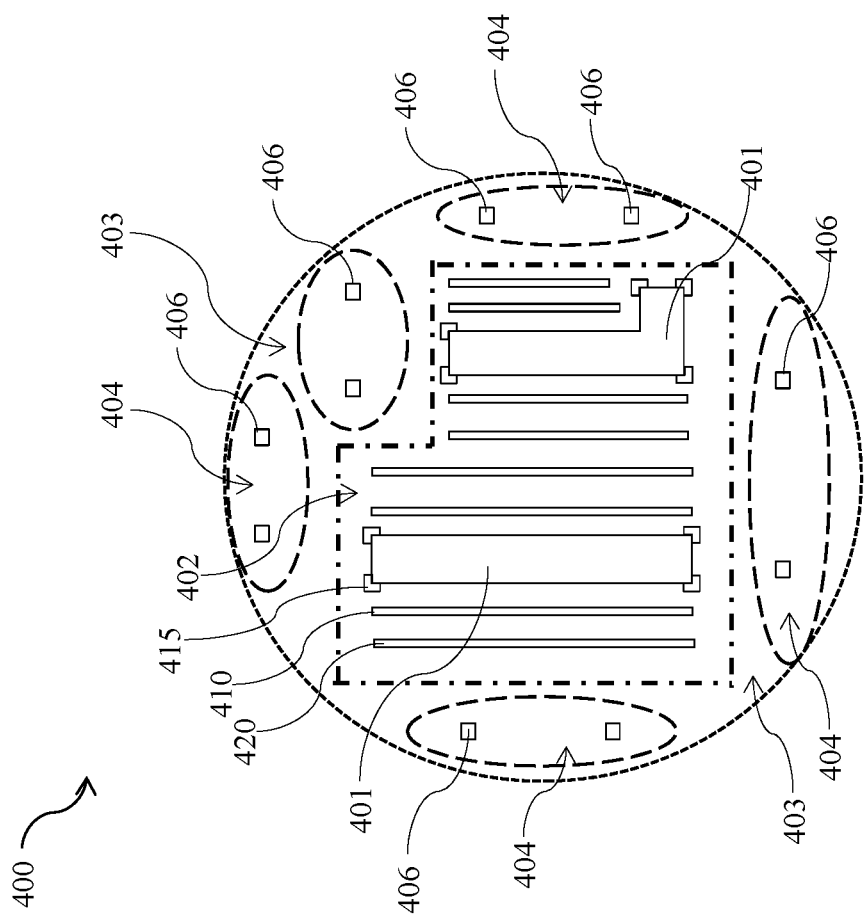
FIG. 4C is a schematic diagrammatic illustration of non-printing features inserted in NPI regions, according to various embodiments of the present disclosure.

Reference is made to FIGS. 3 and 4C, the method 300 proceeds to block 308 where a plurality of non-printing features 406 is inserted into the NPI region 404. Because the NPI region 404 is identified within the isolated region 403, the non-printing features 406 inserted at block 308 provide several advantages. For one, the plurality of non-printing features 406 increases the pattern density within or near the plurality of isolated regions 403 and bridges a pattern density gap between the dense regions 402 and the isolated regions 403. By evening out the pattern density, the non-printing features 406 can eliminate or alleviate the etching behavior difference between the dense regions 402 and the isolated regions 403. For another, because the non-printing features 406 are to be inserted in a region (NPI region 404) where a non-printing feature does not affect the exposure of the printing features 401, the non-printing features 406 can be fabricated with less precision and therefore, with larger process windows. As long as etching rate of the photomask is not unduly lowered by the numerosity of non-printing features 406, more non-printing features 406 can be inserted into the NPI regions 404 to eliminate etching behavior difference between the dense regions 402 and the isolated regions 403. While the isolated region 403 are depicted as a circle in FIGS. 4A, 4B and 4C for simplicity and clarify, it should be understood that the isolated region 403 can be of any shape depending on the distribution of printing features 401 and OPC patterns surrounding the printing features 401. The non-printing features are not going to be printed on a semiconductor wafer as they have widths/lengths that are smaller than a critical size such that they do not reflect sufficient radiation to expose photoresists on the semiconductor wafer.

Figure 5:
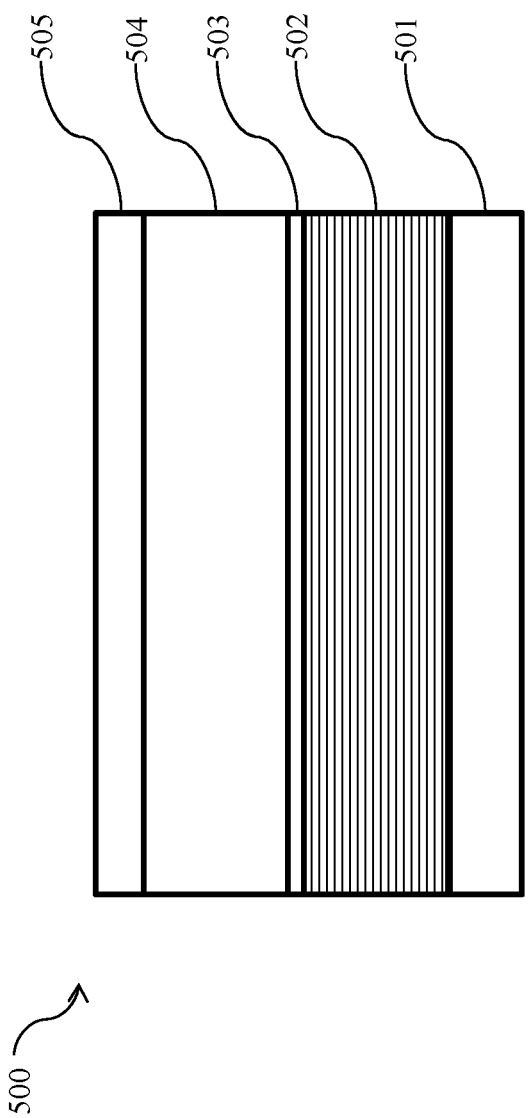
FIG. 5 is a diagrammatic side view of substrate of a photomask, according to various embodiments of the present disclosure.

The method 300 then proceeds to block 310 where a mask is fabricated based on the layout 400. For example, the mask can be fabricated by the mask house 130 at mask fabrication 146 in FIG. 1. Referring now to FIG. 5, shown therein is a diagrammatic side view of a photomask 500. In some embodiments, the photomask 500 includes a substrate 501 made of a low thermal expansion material (LTEM) or fused quartz. The LTEM can include $TiO_2$ doped with $SiO_2$. A reflective multilayer (ML) 502 can then be deposited on the substrate 501. The ML 502 can include a plurality of film pairs such as molybdenum-silicon (Mo—Si) film pairs (e.g. a layer of Mo above or below a layer of Si in each film pair). In some implementations, each of the Mo layers can include a thickness between about 2 nm and about 4 nm, including about 3 nm, and each of the Si layers can include a thickness between about 3 nm and 5 nm, including about 4 nm. Alternatively, the ML 502 may include Mo/beryllium (Mo/Be) film pairs, or other suitable materials that are configurable to be highly reflective of the EUV light. The phase shift mask 500 may include a capping layer 503, such as a ruthenium (Ru) layer, deposited on the ML. The capping layer 503 can have a thickness between about 1.5 nm and about 3.5 nm, including about 2.5 nm. Over the capping layer 503, the phase shift mask may 500 can further include one or more absorption layers 505 and phase shifting layers 504. For example, the phase shifting layer 504 may include a tantalum boron nitride (TaBN) layer, a tantalum boron oxide (TaBO) layer, or a combination thereof. In some embodiments, the phase shift layer 504 may include a TaBN layer that has a thickness between about 40 nm and about 70 nm and a TaBO layer that has a thickness between about 0 nm and about 30 nm. The absorption layer 505 may include a chromium oxynitride ($Cr_xO_yN_z$) layer, an aluminum oxide ($Al_xO_y$) layer, a combination of thereof or a combination of a chromium oxynitride layer, an aluminum layer, and a TaBN layer.

Figure 6:
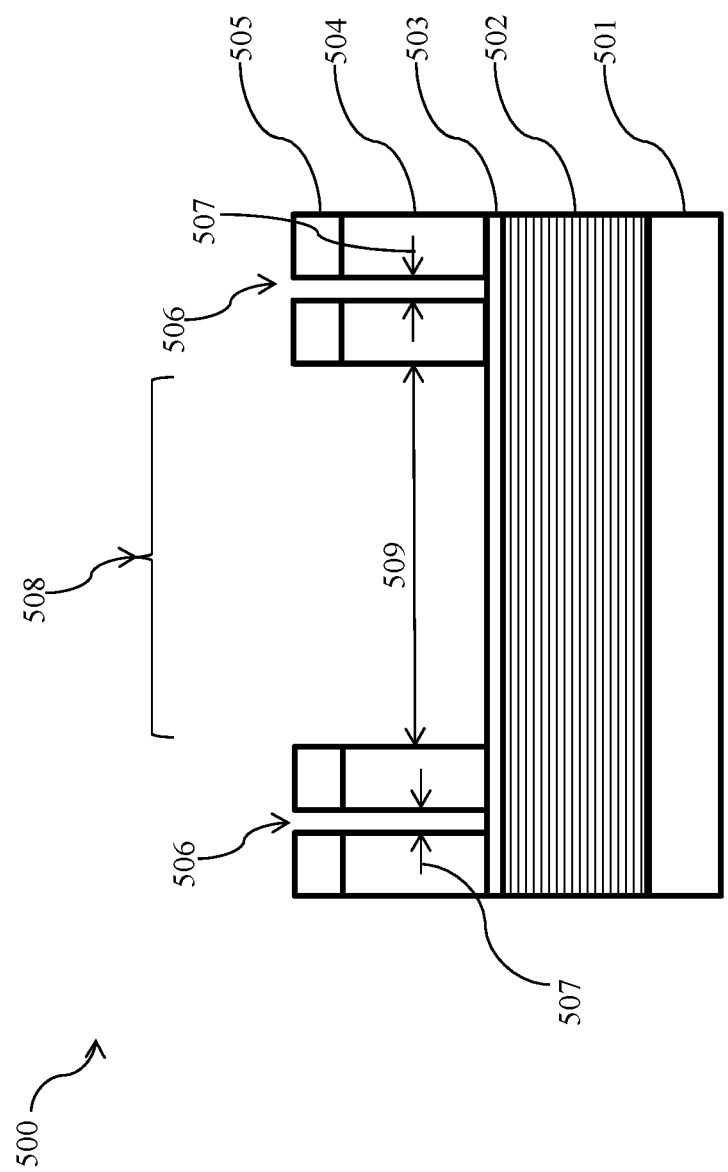
FIG. 6 is a diagrammatic side view of non-printing features on a substrate of a photomask, according to various embodiments of the present disclosure.

Referring now to FIG. 6, shown therein is a schematic diagrammatic side view of non-printing features 506 on the substrate 501 of the photomask 500 around a main pattern 508. In some embodiments, a radiation beam, such as an electron-beam (e-beam) or a mechanism of multiple e-beams, is used to pattern the main patterns and non-printing features 506 on the substrate 501. The non-printing feature 506 has a width 507 that ranges between about 1 nm and 300 nm and has a foot print (i.e. an area) that ranges between about 1 $nm^2$ and about 9,000 $nm^2$. In some such embodiments, non-printing features 506 are substantially square with a width 507 between about 1 nm and 30 nm and a planar area between about 1 $nm^2$ and about 900 $nm^2$. In some embodiments, each of the non-printing features 506 is defined within the entire thickness of the absorption layer 505 and the phase shift layer 504, thereby exposing the capping layer 503. As described above, because the width 507 of the non-printing feature 506 falls below a critical dimension, radiation reflected by the exposed capping layer 503/ML 502 within the non-printing feature 506 does not expose a would-be exposure region in the semiconductor wafer. The main pattern 508 can have a minimum feature dimension 509, which can be a width or a length of the main pattern 508. In some implementations, the width 507 of the non-printing feature 506 is less than one-third (⅓) of the minimum feature dimension 509.

Figure 7:
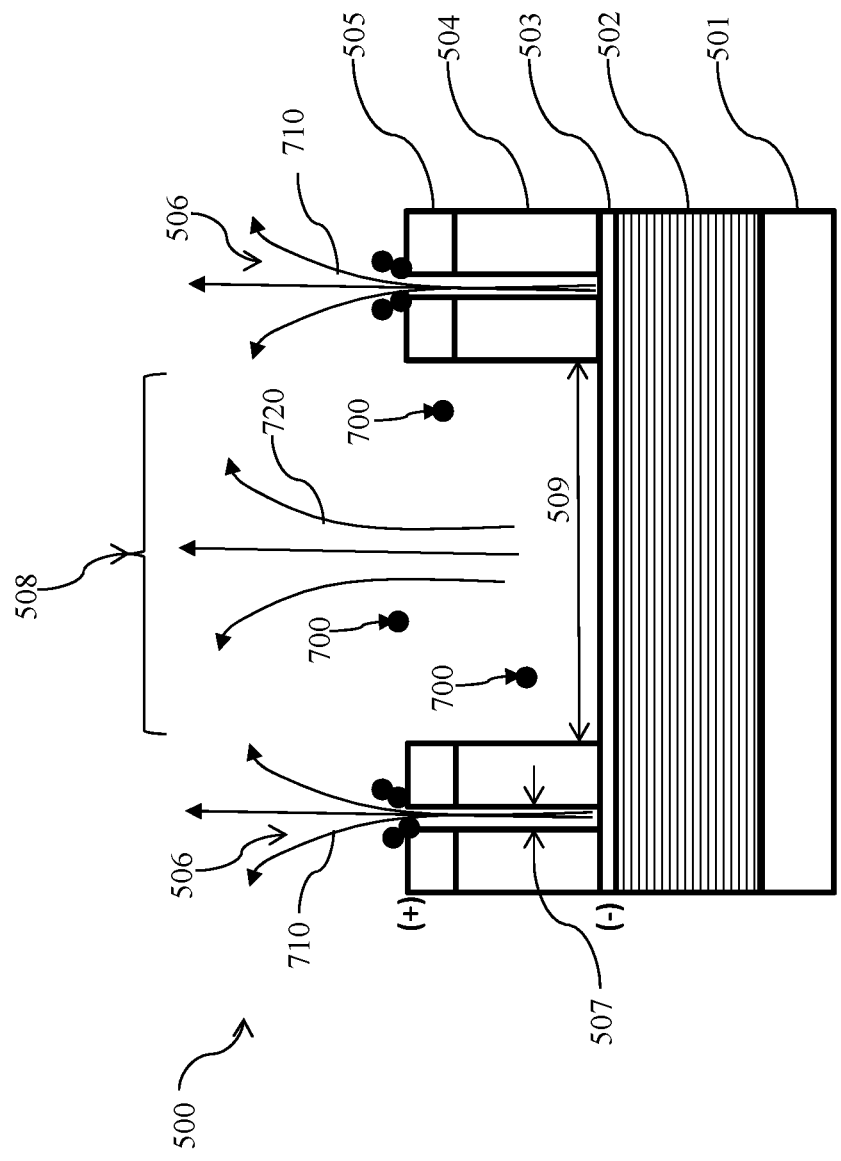
FIG. 7 is a diagrammatic illustration of debris particles attracted to holes of non-printing features on a substrate of a photomask, according to various embodiments of the present disclosure.

Referring now to FIG. 7, shown therein is a schematic diagrammatic illustration of debris particles 700 attracted to non-printing features 506 on the substrate 501 of the photomask 500. In some instances, the capping layer 503 that is formed of ruthenium can become negatively charged and a top surface of absorption layer 505 can become positively charged due to EUV radiation. The negatively charged capping layer 503 and the positively charged absorption layer 505 can form localized electric fields such as electric field 710 at the non-printing features 506 and electric field 720 within the main pattern 508. Because the density of the electric field 710 is inversely proportional to a square of the width 507 and the width 507 is less than ⅓ of the minimum feature dimension 509, the electric field 710 is at least 9 times stronger than the electric field 720. Consequently, when a negatively charged debris particle 700 travels near a surface of the photomask 500, it may be attracted to the non-printing feature 506, rather than to the main pattern 508. As shown in FIG. 7, more debris particles 600 are attracted to the non-printing features 406 than to the main patterns 508. The non-printing features 406 of the present disclosure therefore can advantageously prevent debris particles 700 from travelling to the main pattern 508, thereby prolonging the on-time of the photomask 500 before photomask cleaning is needed. Because photomask cleaning may damage the photomask 500 incrementally, the non-printing features 506 of the present disclosure can also prolong the lifetime of the photomask 500.

Thus, the present disclosure provides examples of a photomask and a method of fabricating the photomask. In some examples, a method includes receiving a layout for forming an integrated circuit device, and the layout includes a set of printing features. A region of the layout is identified that is at a distance from the set of printing features such that an exposure region associated with a feature in the region does not affect a set of exposure regions associated with the set of printing features. A plurality of non-printing features are inserted into the region, and a photomask is fabricated based on the layout. In some such examples, the identifying of the region of the layout includes: identifying a plurality of isolated regions based on a pattern density distribution across the layout, and identifying the region within one of the plurality of isolated regions. In some such examples, the layout further includes first-order OPC patterns and second-order OPC patterns. The second-order OPC patterns are farther away from the set of printing features than the first-order OPC patterns, and the plurality of non-printing features are farther away from the set of printing features than the second-order OPC patterns. In some such examples, the layout further includes third-order OPC patterns. The third-order OPC patterns are farther away from the set of printing features than the second-order OPC patterns, and the plurality of non-printing features are farther away from the set of printing features than the third-order OPC patterns. In some such examples, the plurality of non-printing features are disposed a minimum distance from the set of printing features, and the minimum distance is between about 200 nm and about 8000 nm. In some such examples, each of the plurality of non-printing features comprises an area between about 1 $nm^2$ and about 900 $nm^2$. In some such examples, each printing feature of the set of printing features meets a minimum feature dimension, and each of the plurality of non-printing features has a width smaller than one third of the minimum feature dimension.

In further examples, a method of forming a photomask includes receiving a layout of an integrated circuit (IC) device, and performing an optical proximity correction (OPC) process to incorporate OPC patterns into the layout. The OPC patterns are around a main pattern and are positioned within an area. After performing the OPC process, non-printing features are inserted into the layout, and the non-printing features are positioned outside the area. The photomask is fabricated based on the layout. In some examples, the OPC patterns comprise first-order OPC patterns and second-order OPC patterns. The second-order OPC patterns are farther away from the main pattern than the first-order OPC patterns, and the non-printing features are farther away from the main pattern than the second-order OPC patterns. In some examples, the OPC patterns further comprise third-order OPC patterns. The third-order OPC patterns are farther away from the main pattern than the second-order OPC patterns, and the non-printing features are farther away from the main pattern than the third-order OPC patterns. In some examples, the non-printing features are spaced at least a minimum distance from the main pattern, and the minimum distance is between about 200 nm and about 8000 nm. In some examples, each of the non-printing features comprises an area between about 1 $nm^2$ and 900 $nm^2$.

In yet further examples, a photomask includes: a set of printing features, and a plurality of non-printing features in a region of the photomask. The region is at a distance from the set of printing features such that an exposure region associated with a feature in the region does not affect a set of exposure regions associated with the set of printing features. In some such examples, the photomask includes a plurality of dense regions and a plurality of isolated regions. The plurality of non-printing features is closer to the plurality of isolated regions than to the plurality of dense regions. In some such examples, the photomask includes a plurality of optical proximity correction (OPC) patterns. The plurality of non-printing features is farther away from the set of printing features than the plurality of OPC patterns. In some such examples, the plurality of OPC patterns includes first-order OPC patterns and second-order OPC patterns. In some such examples, the plurality of OPC patterns further includes third-order OPC patterns. In some such examples, the plurality of non-printing features is spaced at least a minimum distance from the set of printing features, and the minimum distance is between about 200 nm and about 8000 nm. In some such examples, each of the plurality of non-printing features comprises an area between about 1 nm$^2$ and about 900 nm$^2$. In some such examples, the set of printing features has a minimum feature dimension, and each the plurality of non-printing features comprises a width smaller than one third of the minimum feature dimension.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    receiving a layout for forming an integrated circuit device, wherein the layout includes a set of printing features and optical proximity correction (OPC) patterns;
    after receiving the layout, identifying a region of the layout, wherein the region is at a distance from the set of printing features such that an exposure region associated with a feature in the region does not affect a set of exposure regions associated with the set of printing features;
    inserting a plurality of non-printing features into the region prior to fabricating any photomask based on the layout; and
    fabricating a photomask based on the layout.

2. The method of claim 1, wherein the identifying of the region of the layout comprises:
    identifying a plurality of isolated regions based on a pattern density distribution across the layout; and
    identifying the region within one of the plurality of isolated regions.

3. The method of claim 1, wherein the OPC patterns includes first-order OPC patterns and second-order OPC patterns,
    wherein the second-order OPC patterns are farther away from the set of printing features than the first-order OPC patterns, and
    wherein the plurality of non-printing features are farther away from the set of printing features than the second-order OPC patterns.

4. The method of claim 3, wherein the OPC patterns further includes third-order OPC patterns,
    wherein the third-order OPC patterns are farther away from the set of printing features than the second-order OPC patterns,
    wherein the plurality of non-printing features are farther away from the set of printing features than the third-order OPC patterns.

5. The method of claim 1, wherein the plurality of non-printing features are disposed a minimum distance from the set of printing features, and
    wherein the minimum distance is between about 200 nm and about 8000 nm.

6. The method of claim 1, wherein each of the plurality of non-printing features comprises an area between about 1 nm$^2$ and about 900 nm$^2$.

7. The method of claim 1, wherein each printing feature of the set of printing features meets a minimum feature dimension, and
    wherein each of the plurality of non-printing features has a width smaller than one third of the minimum feature dimension.

8. A method of forming a photomask, comprising:
    receiving a layout of an integrated circuit (IC) device;
    performing an optical proximity correction (OPC) process to incorporate OPC patterns into the layout, wherein the OPC patterns are around a main pattern and are positioned within an area;
    after performing the OPC process, inserting non-printing features into the layout, wherein the non-printing features are positioned outside the area, wherein the inserting of the non-printing features in the layout occurs prior to fabricating any photomask based on the layout; and
    fabricating the photomask based on the layout.

9. The method of claim 8, wherein the OPC patterns comprise first-order OPC patterns and second-order OPC patterns,
    wherein the second-order OPC patterns are farther away from the main pattern than the first-order OPC patterns, and
    wherein the non-printing features are farther away from the main pattern than the second-order OPC patterns.

10. The method of claim 9, wherein the OPC patterns further comprise third-order OPC patterns,
    wherein the third-order OPC patterns are farther away from the main pattern than the second-order OPC patterns, and
    wherein the non-printing features are farther away from the main pattern than the third-order OPC patterns.

11. The method of claim 8, wherein the non-printing features are spaced at least a minimum distance from the main pattern, and
    wherein the minimum distance is between about 200 nm and about 8000 nm.

12. The method of claim 8, wherein each of the non-printing features comprises an area between about 1 nm$^2$ and 900 nm$^2$.

13. A method comprising:
    receiving a layout of an integrated circuit (IC) device having a set of printing features;
    inserting into the layout a first-order optical proximity correction (OPC) feature and a second-order OPC feature;

inserting a non-printing feature into the layout, wherein the non-printing feature is positioned further away from the set of printing features than the first-order OPC feature and the second-order OPC feature, wherein the inserting of the non-printing feature into the layout occurs prior to fabricating any photomask based on the layout; and after the inserting of the non-printing feature into the layout, fabricating a photomask based on the layout.

14. The method of claim 13, wherein inserting into the layout the first-order OPC feature and the second-order OPC feature includes inserting a third-order OPC feature, and wherein the non-printing feature is positioned further away from the set of printing features than the third-order OPC feature.

15. The method of claim 13, wherein the set of printing features meets a minimum feature dimension, and wherein the non-printing feature has a width smaller than one third of the minimum feature dimension.

16. The method of claim 13, wherein inserting the non-printing feature into the layout includes inserting a plurality of non-printing features into the layout.

17. The method of claim 13, further comprising determining an isolated region in the layout based on a pattern density of the layout prior to inserting the non-printing feature into the layout, and wherein the inserting of the non-printing feature into the layout includes inserting the non-printing feature into the isolated region.

18. The method of claim 17, wherein the pattern density is based on at least the set of printing features, the first OPC feature and the second OPC feature.

19. The method of claim 17, wherein the determining of the isolated region in the layout includes identifying a plurality of isolated regions.

20. The method of claim 13, wherein the non-printing feature is spaced at least a minimum distance from the main pattern, and wherein the minimum distance is between about 200 nm and about 8000 nm.

* * * * *